(12) United States Patent
Saxler

(10) Patent No.: US 7,253,454 B2
(45) Date of Patent: Aug. 7, 2007

(54) HIGH ELECTRON MOBILITY TRANSISTOR

(75) Inventor: Adam William Saxler, Durham, NC (US)

(73) Assignee: Cree, Inc., Durham, NC (US)

( * ) Notice: Subject to any disclaimer, the term of this patent is extended or adjusted under 35 U.S.C. 154(b) by 162 days.

(21) Appl. No.: 11/073,484

(22) Filed: Mar. 3, 2005

(65) Prior Publication Data

US 2006/0197109 A1    Sep. 7, 2006

(51) Int. Cl.
*H01L 31/00* (2006.01)
(52) U.S. Cl. .............................. 257/194; 257/E29.246; 257/E29.248; 257/E29.249
(58) Field of Classification Search ................ 257/194, 257/E29.246, E29.248, E29.249
See application file for complete search history.

(56) References Cited

U.S. PATENT DOCUMENTS

| | | | | |
|---|---|---|---|---|
| 6,533,874 | B1 * | 3/2003 | Vaudo et al. .............. | 148/33.5 |
| 6,727,531 | B1 | 4/2004 | Redwing et al. | |
| 6,849,882 | B2 * | 2/2005 | Walukiewicz et al. ...... | 257/191 |
| 2002/0167023 | A1 | 11/2002 | Chavarkar et al. | |
| 2003/0020092 | A1 | 1/2003 | Parikh et al. | |
| 2003/0102482 | A1 * | 6/2003 | Saxler ......................... | 257/85 |
| 2005/0077538 | A1 * | 4/2005 | Heikman ..................... | 257/183 |
| 2005/0285098 | A1 * | 12/2005 | Fathimulla et al. .......... | 257/20 |
| 2006/0065908 | A1 * | 3/2006 | Beach ......................... | 257/107 |

FOREIGN PATENT DOCUMENTS

JP    2000-196067 A    7/2000

OTHER PUBLICATIONS

Heikman et al., "Polarization effects in AlGaN/GaN and GaN/AlGaN/GaN heterostructures", Journal of Appl. Physics, vol. 93, No. 12, pp. 10114-10118, Jun. 15, 2003.*
Maeda, Narihiko, et al., "Enhanced Electron Mobility in AlGaN/InGaN/AlGaN Double-Heterostrcutures by Piezoelectric Effect," Jpn. J. Appl. Physics, vol. 38, Pt.2, No. 7B, (1999).
Seo, Sanghyun, "AlGaN/GaN High Electron Mobility Transistors (HEMTs)," EECS521 WinternTerm Project Report, ID# 95460550.
Imanaga, Syunji, et al., One-dimensional simulation of charge control in a novel AlN/GaN insulated gate heterostructure field effect transistor w, J. Cryst. Growth, Jun. 15, 1998, pp. 742-748, vol. 189-190.
Liu, Jie, et al., Highly linear Al/sub 0.3/Ga/sub 0.7/N-Al/sub 0.5/Ga/sub 0.95/N-GaN composite-channel HEMTs, IEEE Electron. Dev. Ltrs., Mar. 2005, pp. 145-147, vol. 26, No. 3.

* cited by examiner

*Primary Examiner*—Trung Dang
(74) *Attorney, Agent, or Firm*—Vincent K. Gustafson; Intellectual Property/Technology Law

(57) ABSTRACT

A HEMT device including a GaN channel structure including a very thin (Al,In,Ga)N subchannel layer that is disposed between a first GaN channel layer and a second GaN channel layer, to effect band bending induced from the piezoelectric and spontaneous charges associated with the (Al,In,Ga)N subchannel layer. This GaN channel/(Al,In,Ga)N subchannel arrangement effectively disperses the 2DEG throughout the channel of the device, thereby rendering the device more linear in character (relative to a corresponding device lacking the subchannel (Al,In,Ga)N sub-layer), without substantial loss of electron mobility.

56 Claims, 12 Drawing Sheets

AlN subchannel AlN barrier HEMT

Sheet resistivity ~460 Ω/square

| |
|---|
| 25nm $Al_{0.26}Ga_{0.74}N$ |
| 0.4nm AlN barrier |
| 4nm GaN channel |
| 0.3nm AlN subchannel |
| 1μm GaN |
| 1μm GaN:Fe |
| 200 nm AlN nucleation layer |
| 350 μm HPSI 4H-SiC |

AlN barrier HEMT

Sheet resistivity ~330 Ω/square

| 25nm Al$_{0.26}$Ga$_{0.74}$N |
|---|
| 0.4nm AlN barrier |
| 1μm GaN |
| 1μm GaN:Fe |
| 200 nm AlN nucleation layer |
| 350 μm HPSI 4H-SiC |

FIG. 10

AlGaN channel AlN barrier HEMT

Sheet resistivity ~610 Ω/square

| |
|---|
| 25nm $Al_{0.26}Ga_{0.74}N$ |
| 0.4nm AlN barrier |
| 6nm $Al_{0.06}Ga_{0.94}N$ channel |
| 1μm GaN |
| 1μm GaN:Fe |
| 200 nm AlN nucleation layer |
| 350 μm HPSI 4H-SiC |

FIG. 11

AlN subchannel AlN barrier HEMT

Sheet resistivity ~460 Ω/square

| |
|---|
| 25nm Al$_{0.26}$Ga$_{0.74}$N |
| 0.4nm AlN barrier |
| 4nm GaN channel |
| 0.3nm AlN subchannel |
| 1μm GaN |
| 1μm GaN:Fe |
| 200 nm AlN nucleation layer |
| 350 μm HPSI 4H-SiC |

FIG. 12

HIGH ELECTRON MOBILITY TRANSISTOR

FIELD OF THE INVENTION

The present invention relates to a high electron mobility transistor (HEMT) device.

DESCRIPTION OF THE RELATED ART

Gallium nitride (GaN) and GaN-based materials have physical and electronic properties that make them attractive for high temperature, high power and high frequency microelectronic devices. These properties include wide bandgap character, low thermal carrier generation rates, high breakdown field, high electron mobility and high electron velocity.

These properties of GaN and GaN-based materials render them advantageous for use in high electron mobility transistor devices, characterized by high electron mobilities, superior charge confinement and high breakdown voltage. Room temperature radio frequency (2–10 GHz) output power >2 W/mm is enabled by such GaN and GaN-based materials.

Conventional HEMTs have a narrow peak in the distribution of electrons as a function of depth, which results in a sharp peak in transconductance and poor linearity characteristics. Attempts to improve the linearity of the device have included fabrication of HEMTs with AlGaN channels, to spread the electron distribution. Unfortunately, such devices suffer from significantly reduced electron mobility, since the two-dimensional electron gas (2DEG) is predominately contained within the AlGaN alloy and alloy scattering of the electrons is a significant effect.

It would therefore be a significant advance in the art to provide a HEMT device structure that enables control of electron distribution to produce improved device linearity, without substantial adverse affect on electron mobility characteristics of the device.

SUMMARY OF THE INVENTION

The invention relates in one aspect to a HEMT device including a GaN channel structure with a very thin (<75 Angstroms) (Al,In,Ga)N subchannel layer, e.g., an AlN or AlGaN layer, that is disposed between a main GaN channel and a second GaN channel, to effect band bending induced from the piezoelectric and spontaneous charges associated with the (Al,In,Ga)N subchannel layer, to disperse 2DEG throughout the channel of the device and achieve superior linearity and electron mobility characteristics.

As used herein, "(Al,In,Ga)N subchannel layer" in reference to the intermediate layer between the main GaN channel layer and the second GaN layer in the HEMT device of the invention refers to a layer formed of a nitride composition other than GaN per se, including one or more of aluminum, indium and gallium, wherein the metal(s) in such nitride composition are in appropriate stoichiometric relationship (i.e., $Al_xIn_yGa_zN$ wherein $x+y+z=1$, and each of x, y and z may range in value from 0 to 1, with the proviso that $z \neq 1$). The expression "(Al,In,Ga)N" therefore includes AlN, AlInN, AlInGaN, AlGaN, InGaN and InN as alternative species. AlN and AlGaN are particularly preferred (Al,In,Ga)N species in the broad practice of the invention. It will be appreciated that the channel and subchannel layers in the practice of the invention preferably form one channel, and that the respective layers may be referred to herein as channel structures.

In one aspect, the invention relates to a HEMT device, comprising:
a lower GaN channel layer;
an intermediate (Al,In,Ga)N subchannel layer; and
an upper GaN channel layer, wherein the intermediate (Al,In,Ga)N subchannel layer has a thickness not exceeding 75 Angstroms.

Another aspect of the invention relates to a HEMT device with a channel structure including a (Al,In,Ga)N subchannel layer disposed between a first GaN channel layer and a second GaN channel layer.

A further aspect of the invention relates to a DHFET device, comprising:
a lower GaN channel layer;
an intermediate (Al,In,Ga)N subchannel layer; and
an upper GaN channel layer, wherein the intermediate (Al,In,Ga)N subchannel layer has a thickness not exceeding 75 Angstroms.

Yet another aspect of the invention relates to a method of improving linearity without substantial loss of electron mobility in a HEMT device, including fabricating the HEMT device with a channel structure including first and second GaN channel layers and a (Al,In,Ga)N subchannel layer therebetween.

Other aspects, features and embodiments of the invention will be more fully apparent from the ensuing disclosure and appended claims.

BRIEF DESCRIPTION OF THE DRAWINGS

FIG. 10 is a schematic representation of a HEMT device structure including an AlN barrier layer and characterized by a sheet mobility of ~330 Ω/square.

FIG. 11 is a schematic representation of a HEMT device structure including an AlGaN channel and an AlN barrier layer and characterized by a sheet mobility of ~610 Ω/square.

FIG. 12 is a schematic representation of a HEMT device structure including an AlN subchannel and an AlN barrier layer and characterized by a sheet mobility of ~460 Ω/square.

DETAILED DESCRIPTION OF THE INVENTION, AND PREFERRED EMBODIMENTS THEREOF

Figure 1:
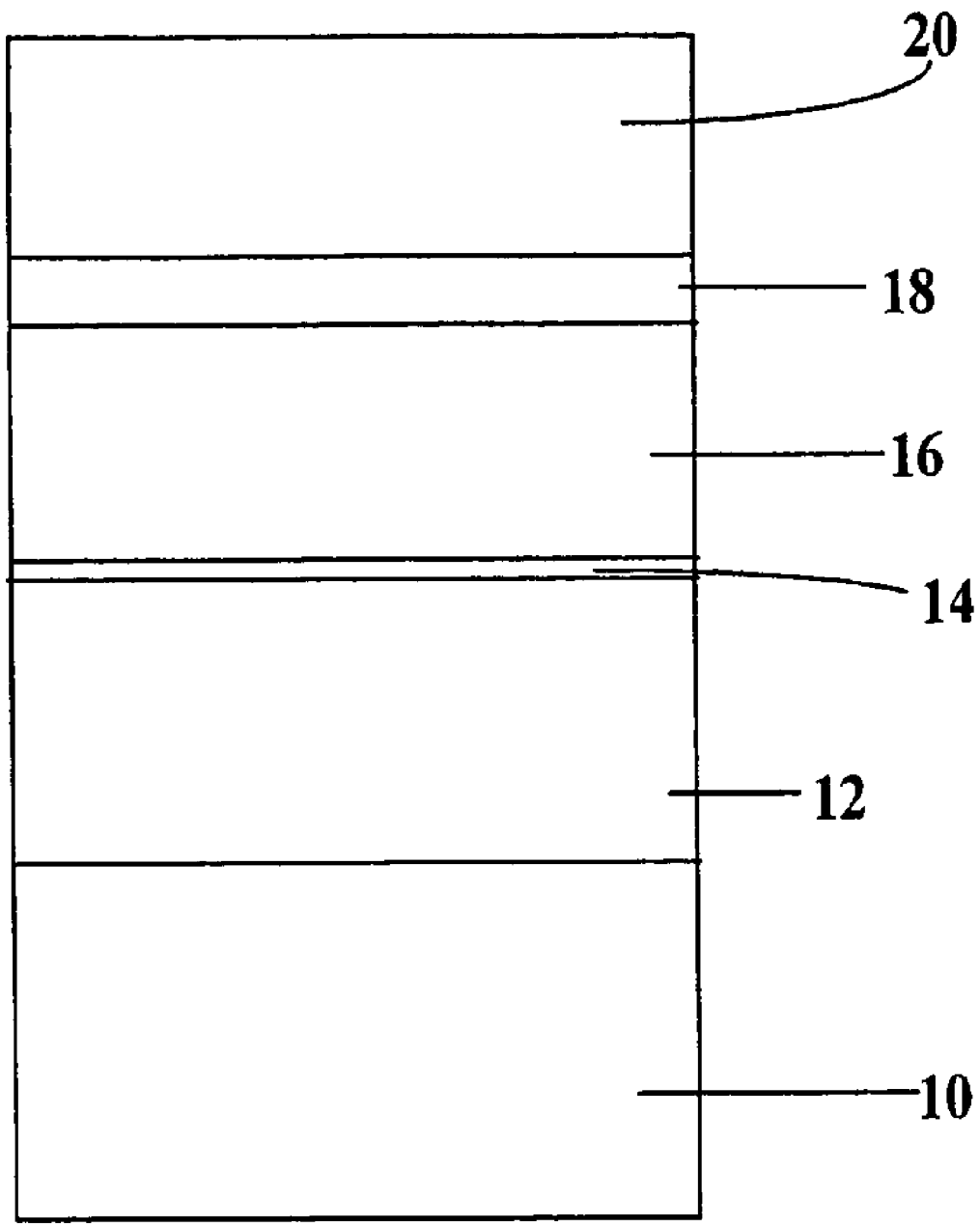
FIG. 1 is a schematic representation of an HEMT device structure according to one embodiment of the present invention.

The present invention relates to a HEMT device including a GaN channel structure with a very thin (Al,In,Ga)N subchannel layer that is disposed between a main GaN channel and a second GaN channel, e.g., below a main GaN channel and above a second GaN channel, to effect band bending induced from the piezoelectric and spontaneous charges associated with the AlInGaN subchannel layer. This GaN channel and (Al,In,Ga)N subchannel arrangement effectively disperses the 2DEG throughout the channel of the device, thereby rendering the device more linear in character (relative to a corresponding device lacking the (Al,In,Ga)N subchannel layer) without substantial loss of electron mobility characteristic of the GaN-based device.

To achieve such band bending, dispersal of 2DEG throughout the channel, high electron mobility and improved linearity, the (Al,In,Ga)N subchannel layer is desirably as thin as possible, preferably being of monolayer or near-monolayer thickness, and in any event not exceeding 75 Angstroms in thickness, and more preferably not exceeding 60 Angstroms in thickness.

It will be appreciated that in specific embodiments of the invention, the thickness of the (Al,In,Ga)N subchannel layer can vary depending on the particular (Al,In,Ga)N subchannel material being employed. In one embodiment, in which the (Al,In,Ga)N subchannel layer is constituted by AlN, such AlN subchannel layer preferably does not exceed 20 Angstroms in thickness, and may for example be 6 Angstroms or less in thickness. In another embodiment in which the (Al,In,Ga)N subchannel layer is formed of AlGaN or AlInGaN, the subchannel thickness preferably does not exceed 50 Angstroms. The choice of a specific material and thickness for the (Al,In,Ga)N subchannel layer in a given device application of the invention, can readily be made by those of ordinary skill in the art, based on the disclosure herein, without undue experimentation.

By the utilization of the (Al,In,Ga)N subchannel layer structure as an intermediate layer in a GaN channel structure formed of overlying and underlying GaN channel layers, the inventive device achieves the beneficial effects realized by AlGaN channels in GaN-based devices, but without the detrimental effect of the high degree of alloy electron scattering that is typical of such AlGaN channel GaN devices.

In one specific embodiment, the subchannel layer in the HEMT device of the invention is formed of AlN or AlGaN, which can be doped or undoped in character, e.g., doped with indium. In other embodiments, the subchannel layer is formed of AlInN or AlInGaN, with the stoichiometric composition of such material preferably being selected to provide a subchannel layer that is substantially lattice matched (within 5% of the lattice coefficient value) to the GaN channel layers adjacent to the respective surfaces of the subchannel layer.

In a particularly preferred embodiment, AlN is used as the material of the subchannel layer. In HEMT structures utilizing AlN subchannel layers in accordance with the invention, the thickness of the AlN subchannel layer can be any suitable thickness effecting the aforementioned band bending, e.g., typically being in a range of from 1 Angstrom to 30 Angstroms in thickness, more preferably in a range of from 2 Angstroms to 10 Angstroms, and most preferably in a range of from 2 Angstroms to 8 Angstroms. As a specific example, subchannel thicknesses on the order of 4 Angstroms have been advantageously employed.

In HEMT device structures utilizing AlGaN subchannel layers in accordance with the invention, the thickness of the AlGaN subchannel layer is generally greater than the thickness of a corresponding subchannel layer formed of AlN, e.g., thicker by the inverse of the aluminum fraction. Accordingly, in specific embodiments, AlGaN subchannel layers can be employed at thickness in a range of from 2 to 60 Angstroms, with a thickness range of from 4 Angstroms to 20 Angstroms being more preferred, and thickness in a range of from 4 Angstroms to 16 Angstroms being most preferred. The stoichiometric composition of the AlGaN subchannel material can be widely varied within the formula $Al_xGa_{1-x}N$, wherein $0<x<1$. In one preferred embodiment, for example, the AlGaN subchannel layer has the stoichiometric formula $Al_{0.5}Ga_{0.5}N$.

Other specific variations of (Al,In,Ga)N subchannel layer compositions can be employed, at various specific thicknesses, within the broad practice of the present invention. For example, the subchannel can be formed of AlInN, with the stoichiometric composition appropriately selected for lattice matching to GaN, e.g., a stoichiometric composition of $Al_{0.83}In_{0.17}N$.

The thickness of the subchannel layer in the GaN channel HEMT device of the invention is of fundamental importance, in providing appropriate band bending and linearity and electron distribution characteristics. If the subchannel layer is excessively thin, not enough band bending will be achieved to simultaneously provide superior linearity and superior electron distribution in the channel. Further, if the subchannel layer is excessively thick, it becomes disproportionately susceptible to the presence of morphological artifacts that render it non-continuous in character. Additionally, all or substantially all of the electrons in the channel remain in the bottom channel layer.

The thickness of the subchannel controls the effective band offset of the respective GaN channel layers, determining the distribution of electrons between the respective upper and lower GaN channels.

Typically, for good linearity and electron mobility characteristics, it is desirable to have more electrons in the top (overlying) GaN channel layer, in relation to the lower (underlying) GaN channel layer. The electron distribution between the two GaN channel layers can be efficiently controlled by choice of appropriate thickness of the (Al,In,Ga)N subchannel layer and thickness of the upper GaN channel. In preferred practice, the top channel layer should contain at least slightly more electrons than the lower channel layer, with effective distributions ranging from such slight excess of electrons in the top channel layer to an order of magnitude more electrons than in the lower GaN channel layer.

As indicated, the (Al,In,Ga)N subchannel layer may be doped or undoped in character. Suitable dopant species for such purpose include, without limitation, silicon (Si) and germanium (Ge). In general, it is desirable to avoid use of oxygen as a dopant species, since it may form DX centers in the subchannel that will deleteriously affect the device performance.

Doping may be selectively applied to modify the electronic profile of the channel, and to minimize ionized impurity scattering.

Doping densities may be of any suitable character, as readily determinable within the skill of the art without undue experimentation, based on the present disclosure. Typical doping densities for Si and Ge can be in a range of from $10^{12}$ atoms/cm$^2$ to $2 \times 10^{13}$ atoms/cm$^2$.

The thicknesses of the upper GaN layer and the bottom GaN layer (above and below the subchannel layer respectively) may be of any suitable thickness appropriate to the specific HEMT device structure. For example, when AlN subchannel layers are utilized, the upper GaN channel layer typically will be greater than 10 Angstroms in thickness, and the bottom GaN layer typically will be greater than 100 Angstroms in thickness. As another example, when AlGaN nucleation layers are utilized, the thickness of the lower GaN layer may be as low as 30 Angstroms in thickness. Thicknesses of the respective GaN layers of the channel structure in specific applications of the invention will be readily determinable within the skill of the art, based on the disclosure herein. By way of further illustrative example, in one specific embodiment, the lower GaN channel layer has a thickness of 1–2 µm, the intermediate AlN subchannel layer has a thickness of 0.2–0.4 nm, and the upper GaN channel layer has a thickness of 3–5 nm.

The channel/subchannel structure of the invention provides significant flexibility and degrees of freedom in relation to channel structures of the prior art. The thicknesses of the GaN channel layers in relation to the subchannel layer thickness can be varied significantly to achieve specific desired physical conformations and performance characteristics. For example, to achieve similar charge in the bottom GaN channel, the upper GaN channel layer may be made thicker and an AlN subchannel layer may be made thinner, while achieving a same or similar overall conformation and performance. Alternatively, n-type doping levels can be reduced in the device structure, to achieve the same result.

The channel structure of the present invention may be deployed in any suitable HEMT device design, e.g., a strain balanced HEMT providing confinement for the bottom channel layer. In one embodiment, the HEMT device is an AlN barrier HEMT.

The gallium nitride channel layers may be formed using any appropriate process or technique. For example, such layers may be formed by vapor phase techniques in which reactant gas species (e.g., ammonia, trimethylgallium) enter a growth reactor in which the substrate is disposed. The reactant gas species can be passed over the substrate to deposit an epitaxial film (e.g., of GaN incorporating nitrogen from ammonia and gallium from trimethylgallium). The process may be carried out at appropriate temperature (e.g., a temperature in a range of from 500° C. to 1200° C., or in a narrower specific temperature range of from 700° C. to 1100° C., or in an even narrower range of from 900° C. to 1000° C. The pressure in the reactor may be maintained at an appropriate level (e.g., in a range of from 20 to 950 millibar). The (Al,In,Ga)N subchannel layer may be formed using any suitable technique or a process known in the art for formation of monolayer or near-monolayer films, such as MBE, MOCVD, ALE or the like, and appropriate reagents such as those mentioned above, trimethylaluminum, trimethylindium, etc. The substrate can be a wafer of gallium nitride, silicon carbide, aluminum nitride, aluminum gallium nitride, sapphire, diamond, silicon, etc.

In a specific embodiment, the channel layer structure of the invention is employed in a double heterojunction field effect transistor (DHFET), e.g., a DHFET device in which the subchannel layer is formed of AlGaN.

Referring now to the drawings, FIG. 1 is a schematic representation of a HEMT device structure according to one embodiment of the present invention.

The HEMT device structure shown in FIG. 1 includes a substrate 10, which may be of any suitable type, e.g. a homoepitaxial GaN substrate, or alternatively a heteroepitaxial substrate formed of silicon carbide, aluminum nitride, diamond, sapphire, silicon, or other appropriate material. Although not shown, the substrate 10 may include a nucleation layer, e.g., of AlN or other suitable material, at a thickness that can for example be on the order of 2000 Angstroms. Further, strain compensation layers can be employed as necessary or desired for heteroepitaxial substrates. Such nucleation layers and strain compensation layers are well known in the art and require no detailed description here, and may advantageously form part of substrate or buffer layers in device structures of the present invention.

Overlying the substrate 10 including optional nucleation and/or strain compensation layer(s), is a GaN buffer layer 12, on which (Al,In,Ga)N subchannel layer 14 has been formed. By such arrangement, the GaN buffer layer 12 defines a lower channel region in the vicinity of (Al,In,Ga)N subchannel layer 14. Overlying the (Al,In,Ga)N subchannel layer 14 is an upper GaN channel layer 16 that defines an upper channel region in the vicinity of the subchannel layer 14. The subchannel layer in this illustrative embodiment can be formed of AlN, for example, or alternatively it can be formed of AlGaN or other suitable (Al,In,Ga)N subchannel layer material.

Overlying the upper GaN channel layer 16 is an optional AlN barrier 18. Top layer 20, overlying the upper GaN channel layer 16 and optional AlN barrier 18, is an Al$_x$In$_y$Ga$_z$N cap layer, formed for example of AlGaN or alternatively of GaN, on the upper surface of which can be disposed conventional source, gate and drain elements (not shown in FIG. 1). The barrier layer 18 and cap layer 20 can be widely varied in composition and conformation, as well as in processing (e.g., doping, recessing, passivation, etc.). In the Al$_x$In$_y$Ga$_z$N cap layer, each of x, y and z has a value of from 0 to 1 inclusive, with x+y+z=1, and each of x, y and z can optionally vary with depth, so that an AlN/AlGaN/GaN cap or a graded AlInGaN layer may be present, in specific embodiments.

The (Al,In,Ga)N subchannel layer 14 in FIG. 1 is desirably as close to a monomolecular layer as possible, e.g., 1, 2 or 3 molecular layers in thickness, and most preferably is of monolayer thickness across the full area extent of the top surface of the lower GaN channel layer 12. The (Al,In,Ga)N subchannel layer may for example be formed of AlN and have a thickness on the order of 2.5 to 5 Angstroms, and the upper GaN channel layer 16 may have a channel thickness on the order of 30–50 Angstroms. The (Al,In,Ga)N subchannel layer can be formed by any suitable growth methodology.

As discussed herein above, it is desirable to keep the (Al,In,Ga)N subchannel layer as thin as possible, in order to maintain suitable electron density in the lower GaN channel layer and to minimize the negative spike in electron density in the vicinity of the AlN subchannel layer. It may also be beneficial to have a very low, e.g., monolayer, thickness in the subchannel, to achieve reduced alloy and roughness scattering, as well as reproducibility of the subchannel dimensions by deposition techniques such as atomic layer epitaxy (ALE).

The structure shown in FIG. 1 may be varied in relative thicknesses of component layers as may be necessary or desired in a specific application to achieve desired electron density and output performance. For example, by making the overlying GaN channel layer 16 thinner, the negative spike in electron density (associated with the subchannel layer) is rendered less severe, and electron density in the underlying GaN channel layer increases. One of skill in the art can readily determine the appropriate relative thicknesses of the component layers of the HEMT device as necessary or desirable in a specific device application, by empirical determination and/or appropriate analytical techniques, e.g., use of the Schrödinger's equation for characterizing channel formation and current flow mechanisms in channel/subchannel structures of the present invention.

Figure 2:
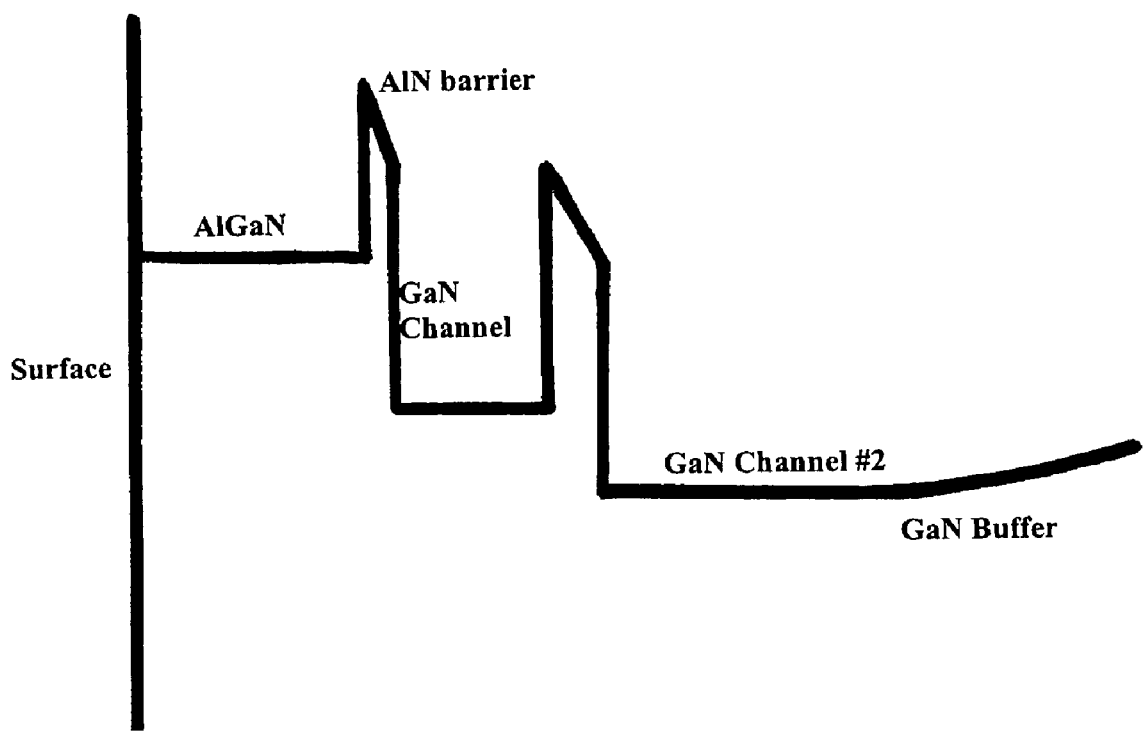
FIG. 2 is a band diagram of the device of FIG. 1.

FIG. 2 is a band diagram of the device of FIG. 1, showing that the AlN subchannel layer gives a step in the energy band and some spill-down of charge, with the upper GaN channel layer of higher electron content in relation to the lower GaN channel layer (GaN channel #2).

Figure 3:
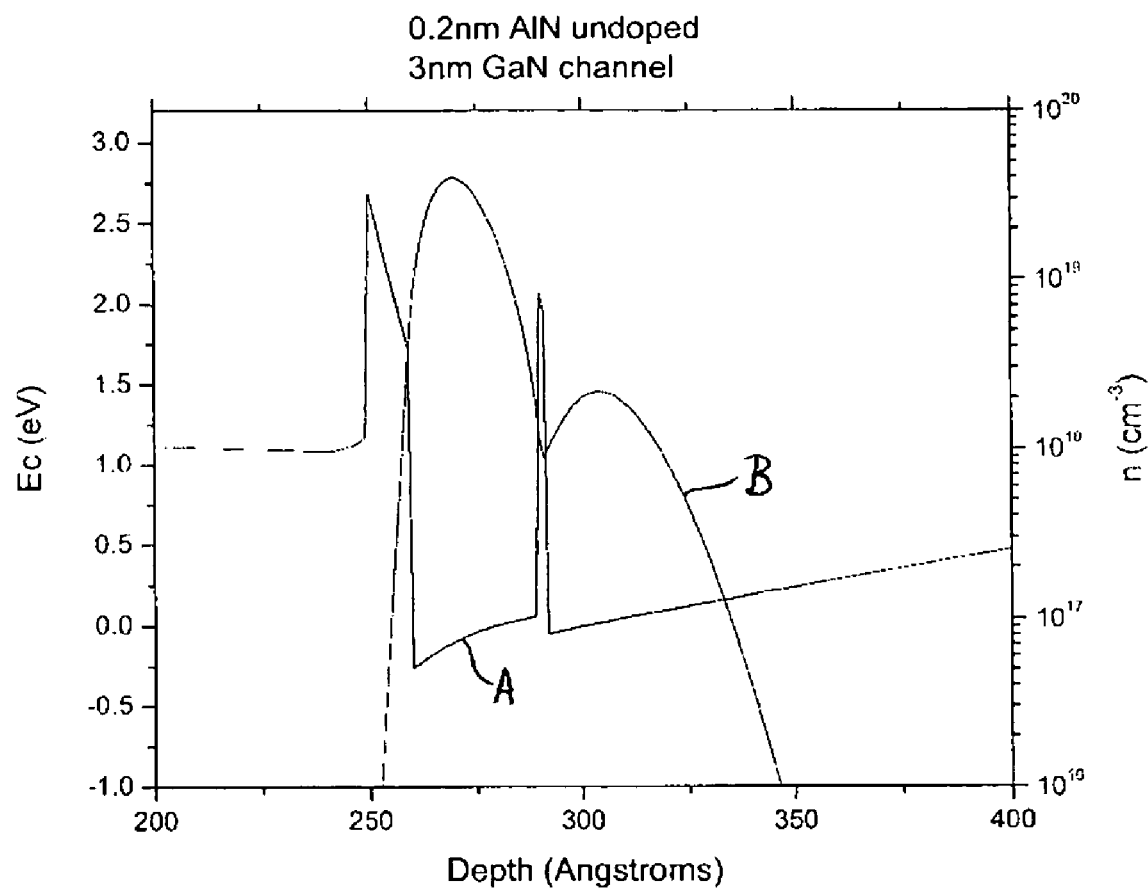
FIG. 3 is a graph of conduction band edge, $E_c$, in electron volts (eV) and carrier concentration, in $cm^{-3}$, as a function of depth in Angstroms, for a structure including a 3 nm thick GaN channel and a 0.2 nm AlN undoped subchannel.

FIG. 3 is a graph of conduction band edge (curve A), $E_c$, in electron volts (eV), and carrier concentration (curve B), in $cm^{-3}$, as a function of depth, in Angstroms, for a structure including a 3 nm thick GaN channel and a 0.2 nm AlN undoped subchannel.

The FIG. 3 profile shows the upper GaN channel layer electron density having a roughly parabolic shape with a peak of about 5E19 $cm^{-3}$ at a depth of about 270 Angstroms, and the lower GaN channel layer electron density exhibits a peak of about 2E18 $cm^{-3}$ at a depth of about 310 Angstroms, with the AlN subchannel layer being centered at a depth of about 290 Angstroms in the structure.

Figure 4:
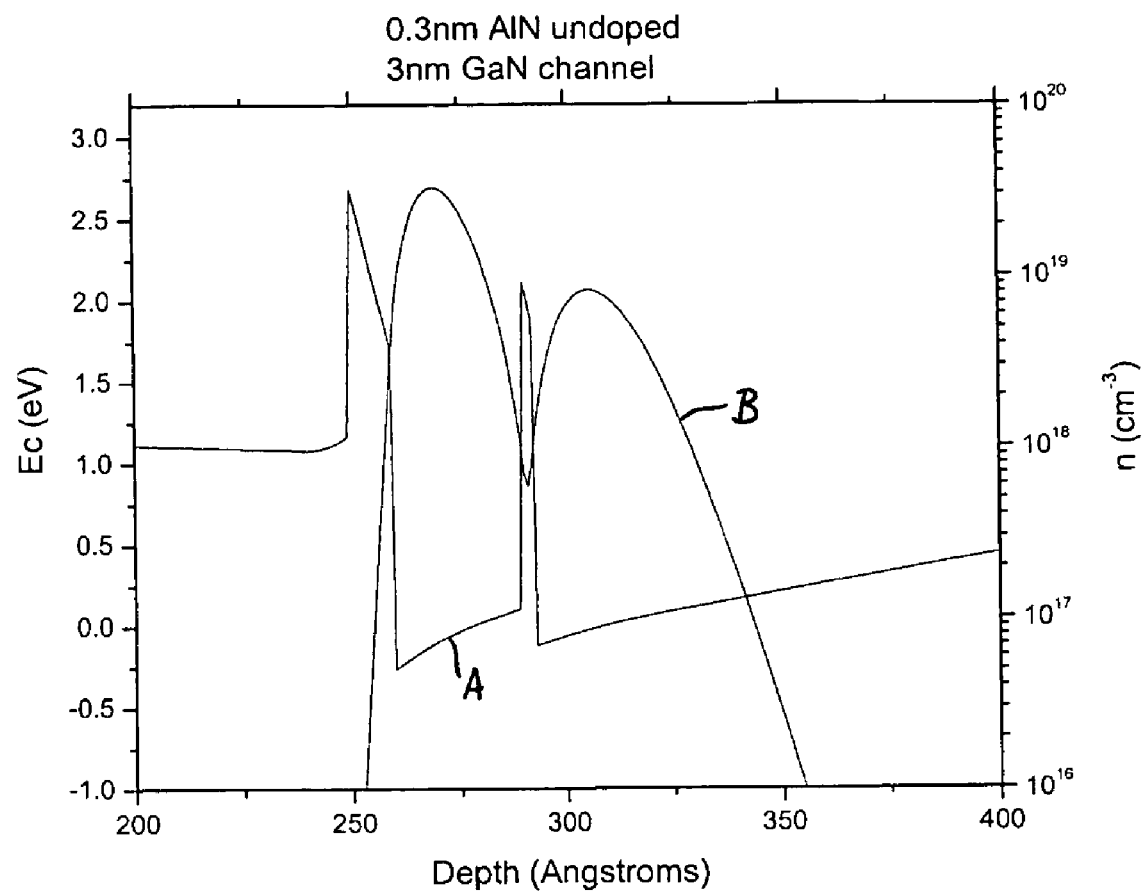
FIG. 4 is a graph of conduction band edge, $E_c$, in electron volts (eV) and carrier concentration, in $cm^{-3}$, as a function of depth in Angstroms, for a structure including a 3 nm thick GaN channel and a 0.3 nm AlN undoped subchannel.

FIG. 4 is a graph of conduction band edge (curve A), $E_c$, in electron volts (eV), and carrier concentration (curve B), in $cm^{-3}$, as a function of depth, in Angstroms, for a structure including a 3 nm thick GaN channel and a 0.3 nm AlN undoped subchannel. The profile shapes for the upper and lower GaN channel layers in FIG. 4 as compared to FIG. 3 shows that an increase in the subchannel thickness by 50% (0.3 nm vs. 0.2 nm) effects a more uniform distribution of charge between the respective channel layers, with the upper GaN layer nonetheless retaining more charge than the lower GaN channel layer.

Figure 5:
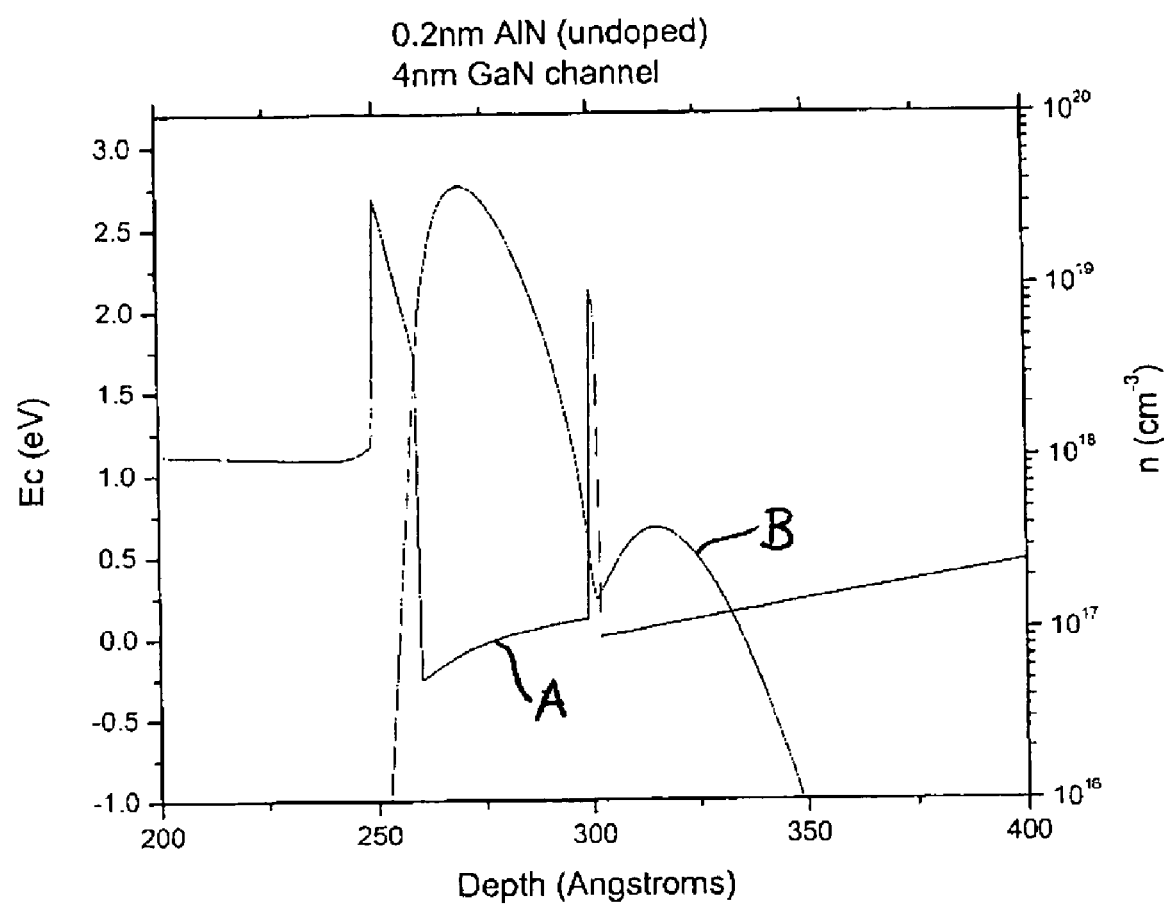
FIG. 5 is a graph of conduction band edge, $E_c$, in electron volts (eV) and carrier concentration, in $cm^{-3}$, as a function of depth in Angstroms, for a structure including a 4 nm thick GaN channel and a 0.2 nm AlN undoped subchannel.

FIG. 5 is a graph of conduction band edge (curve A), $E_c$, in electron volts (eV), and carrier concentration (curve B), in $cm^{-3}$, as a function of depth, in Angstroms, for a structure including a 4 nm thick GaN channel and a 0.2 nm AlN undoped subchannel.

In relation to the conduction band graphs of FIGS. 3 and 4, FIG. 5 shows the effect of increased thickness of the GaN channel layer. In the FIG. 5 structure, the upper GaN channel layer has 33.3% greater thickness (i.e., a 4 nm thick GaN channel layer) than the structures of FIGS. 3 and 4. Such increase in upper channel thickness increases the charge of the upper channel layer in relation to the charge of the lower channel layer.

Figure 6:
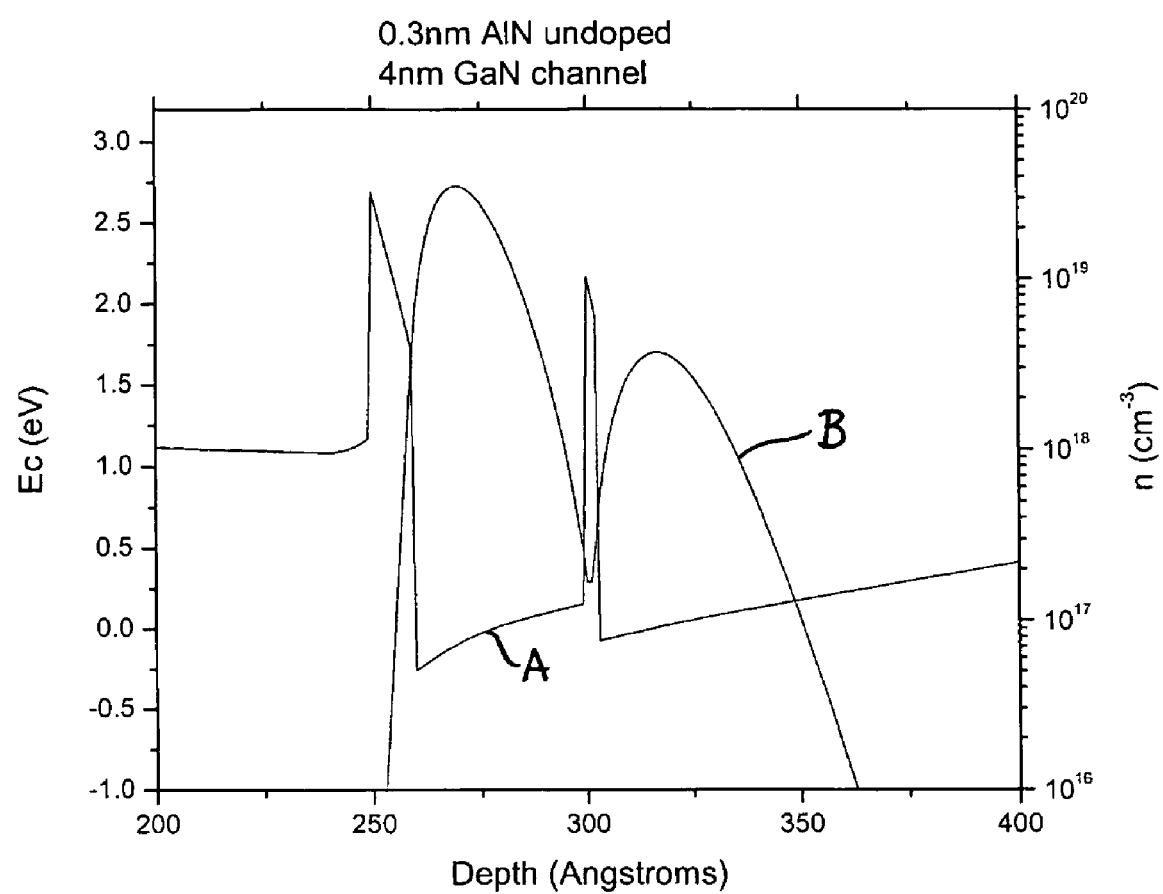
FIG. 6 is a graph of conduction band edge, $E_c$, in electron volts (eV) and carrier concentration, in $cm^{-3}$, as a function of depth in Angstroms, for a structure including a 4 nm thick GaN channel and a 0.3 nm AlN undoped subchannel.

FIG. 6 is a graph of conduction band edge (curve A), $E_c$, in electron volts (eV), and carrier concentration (curve B), in $cm^{-3}$, as a function of depth, in Angstroms, for a structure including a 4 nm thick GaN channel and a 0.3 nm AlN undoped subchannel.

Comparing FIGS. 5 and 6, it is seen that increasing the subchannel AlN layer thickness increases the amount of charge in the lower channel GaN layer.

Figure 7:
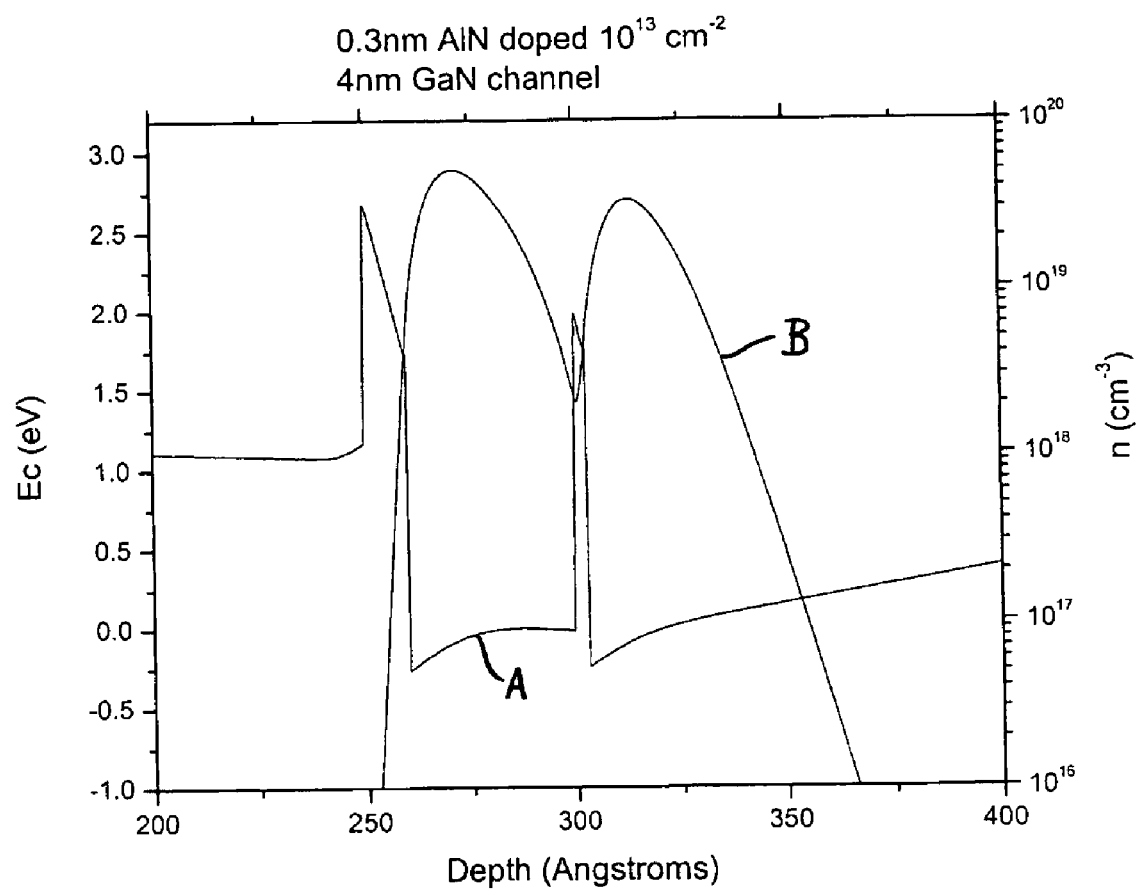
FIG. 7 is a graph of conduction band edge, $E_c$, in electron volts (eV) and carrier concentration, in $cm^{-3}$, as a function of depth in Angstroms, for a structure including a 4 nm thick GaN channel and a 0.3 nm AlN layer doped with silicon at a doping density of $10^{13}$ atoms/$cm^2$.

FIG. 7 is a graph of conduction band edge (curve A), $E_c$, in electron volts (eV), and carrier concentration (curve B), in $cm^{-3}$, as a function of depth, in Angstroms, for a structure including a 4 nm thick GaN channel and a 0.3 nm AlN doped with silicon at a doping density of $10^{13}$ atoms/$cm^2$.

The effect of silicon doping of the subchannel layer is shown in FIG. 7 as altering the relative charge of the respective upper and lower GaN channel layers, so that they are more nearly equal to one another, but with the upper GaN channel layer containing slightly more charge than the lower GaN channel layer. Total charge also is increased relative to an undoped structure.

Figure 8:
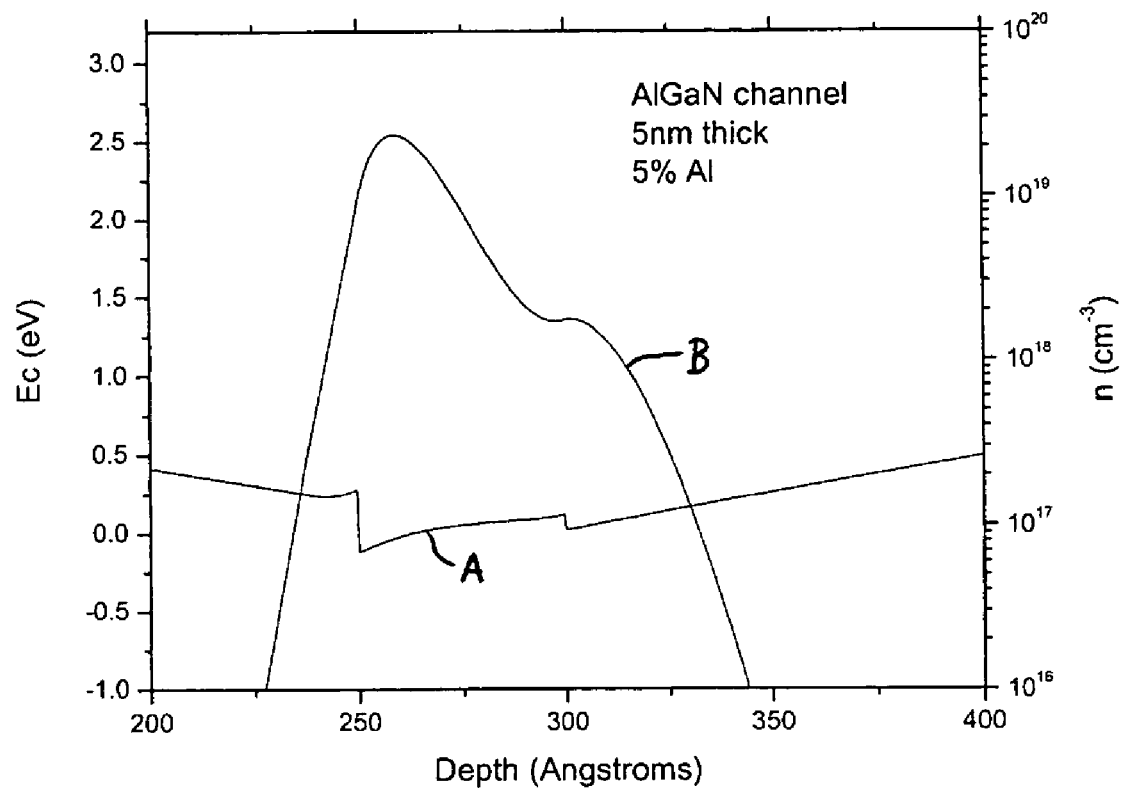
FIG. 8 is a graph of conduction band edge, $E_c$, in electron volts (eV) and carrier concentration, in $cm^{-3}$, as a function of depth in Angstroms, for a device structure including a 5 nm thick AlGaN channel, containing 5% aluminum in the AlGaN channel material.

FIG. 8 is a graph of conduction band edge (curve A), $E_c$, in electron volts (eV), and carrier concentration (curve B), in $cm^{-3}$, as a function of depth, in Angstroms, for a device structure including a 5 nm thick AlGaN channel, containing 5% aluminum in the AlGaN channel material.

Figure 9:
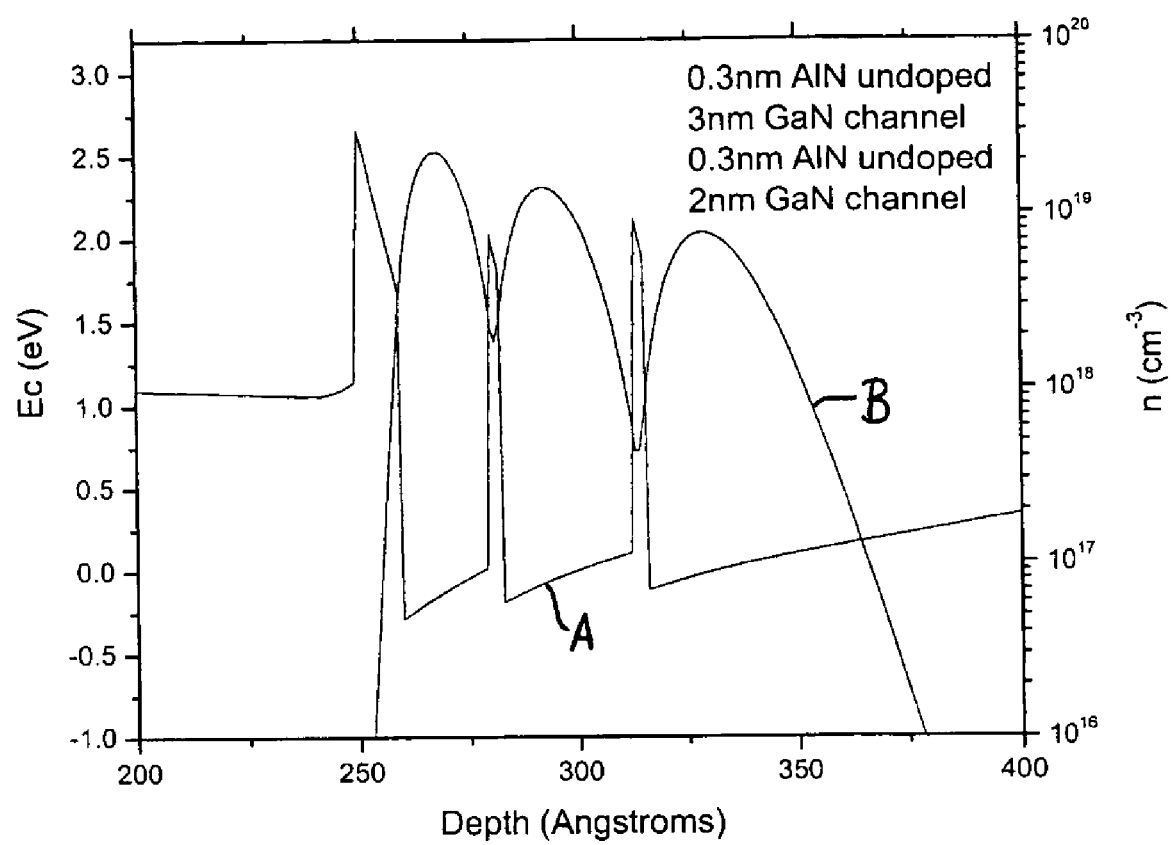
FIG. 9 is a graph of conduction band edge, $E_c$, in electron volts (eV) and carrier concentration, in $cm^{-3}$, as a function of depth in Angstroms, for a device structure including a 2 nm GaN channel, a 0.3 nm undoped AlN layer, a 3 nm GaN channel and a 0.3 nm undoped AlN layer.

FIG. 9 is a graph of conduction band edge (curve A), $E_c$, in electron volts (eV), and carrier concentration (curve B), in $cm^{-3}$, as a function of depth in Angstroms, for a device structure including a 2 nm GaN channel, a 0.3 nm undoped AlN layer, a 3 nm GaN channel and a 0.3 nm undoped AlN layer.

The features and advantages of the invention are more fully shown with respect to the following non-limiting examples.

EXAMPLES

Referring now to the further drawings FIGS. 10–12, FIG. 10 is a schematic representation of a HEMT device structure including an AlN barrier layer and characterized by a sheet mobility of ~330 Ω/square, FIG. 11 is a schematic representation of a HEMT device structure including an AlGaN channel and an AlN barrier layer and characterized by a sheet mobility of ~610 Ω/square, and FIG. 12 is a schematic representation of a HEMT device structure including an AlN subchannel and an AlN barrier layer and characterized by a sheet mobility of ~460 Ω/square.

In each of FIGS. 10–12, the thicknesses of the respective layers in the device structure are set out in appropriate dimensional units of microns (μm) or nanometers (nm).

Each of the AlN barrier HEMT structures in FIGS. 10–12 was grown under substantially the same growth conditions as the others. All epitaxial III-Nitride layers were deposited by low pressure MOCVD (metalorganic chemical vapor deposition). Precursors used were trimethylgallium (TMGa), trimethylaluminum (TMAl), and ammonia ($NH_3$). The carrier gas was a mixture of hydrogen and nitrogen. The growth temperature was approximately 1000° C.

FIG. 10 schematically depicts an AlN barrier HEMT. This device exhibited enhanced mobility and reduced sheet resistivity of about 330 Ω/square attributable to the thin AlN barrier. The substrate was a 350 μm thick high-purity semi-insulating (HPSI) 4H—SiC substrate, on which was deposited an AlN nucleation layer at a thickness of 200 nm. Overlying the nucleation layer is a 1 μm thick GaN:Fe film, on which in turn was deposited a 1 μm thick layer of gallium nitride. On such GaN layer was deposited a 0.4 nm thick AlN barrier layer, which in turn was capped with a 25 nm thick layer of $Al_{0.26}Ga_{0.74}N$. This AlN barrier HEMT had a sheet resistivity of approximately 330 Ω/square.

FIG. 11 is a schematic representation of an AlGaN channel AlN barrier HEMT device, which had a same layer sequence as the HEMT device structure in FIG. 10, except that an additional layer was present in the FIG. 11 structure, between the 1 μm thick GaN layer and the 0.4 nm AlN barrier layer. This additional layer was a 6 nm $Al_{0.06}Ga_{0.94}N$ channel layer. This AlGaN channel AlN barrier HEMT had a sheet resistivity of approximately 610 Ω/square. In relation to the FIG. 10 HEMT, the electron mobility in the FIG. 11 device was significantly reduced, and the sheet resistivity was increased by about 85%, an increase consistent with higher alloy scattering of electrons in the ternary channel.

FIG. 12 is a schematic representation of an AlN subchannel AlN barrier HEMT. This device structure had the same layer sequence as the HEMT device structure shown in FIG. 10, except that two additional layers were present in the FIG. 12 structure, between the 1 μm thick GaN layer and the 0.4 nm AlN barrier layer. These additional layers were a 0.3 nm thick AlN subchannel layer deposited on the 1 μm thick GaN layer and a 4 nm thick GaN channel layer deposited on the AlN subchannel layer.

In relation to the HEMT device structure of FIG. 11, the HEMT device structure of FIG. 12 replaced the AlGaN channel of the FIG. 11 device with a GaN channel layer and an AlN subchannel layer. The HEMT device of FIG. 12 exhibited a sheet resistivity of approximately 460 Ω/square, still greater than the AlN barrier HEMT of FIG. 10, but significantly better (approximately 25% lower) than the AlGaN channel structure HEMT of FIG. 11.

While the invention has been has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A HEMT device comprising:
   at least four layers comprising (Al, In, Ga)N materials, said four layers defining three heterojunctions disposed in sufficient proximity to generate a charge density profile as a function of depth having two local maxima and a nonzero local minimum disposed between the two local maxima;
   wherein each heterojunction comprises an interface between (Al, In, Ga)N materials sufficiently different in bandgap character that a two-dimensional electron gas is formable therebetween; and
   wherein the local minimum corresponds to an intermediate (Al, In, Ga)N subchannel layer of said at least four layers, said subchannel having a thickness not exceeding 75 Angstroms and being disposed between two channel layers of said at least four layers corresponding to said two local maxima.

2. The HEMT device of claim 1, wherein the first local maximum is disposed at a first depth relative to an upper surface of the device, the second local maximum is disposed at a second depth greater than the first depth relative to the upper surface, and the first local maximum is greater than the second local maximum.

3. The HEMT device of claim 1, wherein said two channel layers are formed of GaN.

4. The HEMT device of claim 1, wherein said subchannel layer has a thickness not exceeding 60 Angstroms.

5. The HEMT device of claim 1, wherein said subchannel layer is of monolayer or near-monolayer thickness.

6. The HEMT device of claim 1, wherein said subchannel layer is formed of AlN.

7. The HEMT device of claim 6, wherein said subchannel layer has a thickness not exceeding 20 Angstroms.

8. The HEMT device of claim 1, wherein said subchannel layer is fanned of AlGaN or AlInGaN.

9. The HEMT device of claim 8, wherein said subchannel layer has a thickness not exceeding 50 Angstroms.

10. The HEMT device of claim 1, wherein said subchannel layer is formed of AlN or AlGaN.

11. The HEMT device of claim 10, wherein said subchannel layer is doped.

12. The HEMT device of claim 11, wherein said subchannel layer is doped with indium.

13. The HEMT device of claim 1, wherein the channel layers are formed of GaN, and the subchannel layer is formed of AlInN or AlInGaN having a stoichiometric composition that is substantially lattice matched to the GaN channel layers.

14. The HEMT device of claim 1, wherein said subchannel layer has a thickness in a range of from 1 to 30 Angstroms.

15. The HEMT device of claim 1, wherein said subchannel layer has a thickness in a range of from 2 to 10 Angstroms.

16. The HEMT device of claim 1, wherein said subchannel layer has a thickness in a range of from 2 to 8 Angstroms.

17. The HEMT device of claim 1, wherein said subchannel layer has a thickness in a range of from about 4 to about 5, Angstroms.

18. The HEMT device of claim 1, wherein said subchannel layer is formed of AlGaN.

19. The HEMT device of claim 18, wherein said subchannel layer has a thickness in a range of from 2 to 60 Angstroms.

20. The HEMT device of claim 18, wherein said subchannel layer has a thickness in a range of from 4 to 20 Angstroms.

21. The HEMT device of claim 1, wherein said subchannel layer is formed of a material selected from die group consisting of $Al_{0.5}Ga_{0.83}In_{0.17}N$.

22. The HEMT device of claim 1, wherein said subchannel layer is formed of AlInN.

23. The HEMT device of claim 1, wherein said subchannel layer is formed of AlInGaN.

24. The HEMT device of claim 1, wherein said two channel layers comprise an upper channel layer and a lower channel layer, and the upper and lower channel layers and the intermediate subchannel layer are constructed and arranged to provide at least slightly more electrons in the upper channel layer than in the lower channel layer in operation of the device.

25. The HEMT device of claim 1, wherein said two channel layers comprise an upper channel layer and a lower channel layer, and the upper and lower channel layers and the intermediate subchannel layer are constructed and arranged to provide number of electrons in the upper GaN channel layer in a range of from (i) a slight excess of electrons in the upper GaN channel layer than in the lower GaN channel layer, up to (ii) an order of magnitude more electrons in the upper GaN channel layer than in the lower GaN channel layer.

26. The HEMT device of claim 1, wherein said intermediate channel layer is doped with, any of Si and Ge.

27. The HEMT device of claim 1, wherein said subchannel layer is doped at a doping density in a range of from $10^{12}$ atoms/cm$^2$ to $2\times10^{13}$ atoms/cm$^2$.

28. The HEMT device of claim 6, wherein said two channel layers comprise an upper channel layer and a tower channel layer, the upper channel layer is greater than 10 Angstroms in thickness, and the lower channel layer is greater than 100 Angstroms in thickness.

29. The HEMT device of claim 18, wherein said two channel layers comprise an upper channel layer and a lower channel layer, and the upper GaN channel layer is at least 30 Angstroms in thickness.

30. The HEMT device of claim 6, wherein said two channel layers comprise an upper channel layer and a lower channel layer, and lower channel layer has a thickness of 1–2 μm, the intermediate AlN subchannel layer has a thickness of 0.2–0.4 nm, and the upper channel layer has a thickness of 3–5 nm.

31. The HEMT device of claim 1, comprising a strain-balanced HEMT device.

32. The HEMT device of claim 1, comprising an AlN barrier HEMT.

33. The HEMT device of claim 1, comprising a substrate Formed of any of GaN, silicon carbide, aluminum nitride, aluminum gallium nitride, diamond, sapphire, and silicon.

34. The HEMT device of claim 1, comprising a substrate including at least one nucleation layer.

35. The HEMT device of claim 1, comprising a substrate including at least one strain compensation layer.

36. The HEMT device of claim 1, wherein said at least four layers include any of a barrier layer and a cap layer, overlying a channel layer of said two channel layers.

37. The HEMT device of claim 36, wherein said at least four layers include a barrier layer formed of AlN.

38. The HEMT device of claim 36, wherein said at least four layers include a cap layer formed of Al$_x$In$_y$Ga$_z$N, wherein: each of x, y and z has a value of from 0 to 1 inclusive; x+y+z =1; and each of x, y and z can optionally vary with depth.

39. The HEMT device of claim 38, wherein said cap layer is formed of AlGaN.

40. The HEMT device of claim 38, wherein said cap layer is formed of GaN.

41. The HEMT device of claim 1, wherein said two channel layers comprise an upper GaN channel layer and a lower GaN channel layer, and the upper GaN channel layer has a thickness in a range of from 0 to 50 Angstroms.

42. The HEMT device of claim 41, wherein said subchannel layer is formed of AlN having a thickness in a range of from 1 to 3 molecular layers.

43. The HEMT device of claim 1, comprising a high-purity semi-insulating (HPSI) 4W—SiC substrate, having deposited thereon an AlN nucleation layer, with a GaN:Fe layer deposited on the nucleation layer, and said at least four layers include;
a lower GaN channel layer of said two channel layers, deposited on the GaN:Fe layer,
said subchannel layer being formed of AlN and deposited on the lower CaN channel layer;
an upper GaN channel layer of said two channel layers, deposited on the subchannel layer,
an AlN barrier layer deposited on the upper GaN channel layer; and
an AlGaN capping layer deposited on the AlN barrier layer.

44. The HEMT device of claim 1, wherein said subchannel layer is formed of AlN and is of monolayer or substantially monolayer thickness.

45. The HEMT device of claim 1, wherein the presence of said subchannel layer increases sheet resistance of the device.

46. The HEMT device of claim 1, characterized by enhanced linearity in response compared to a comparable HEMT device lacking said subchannel layer.

47. A FET device comprising:
at least four layers comprising (Al, In, Ga)N materials, said four layers defining three heterojunctions disposed in sufficient proximity to generate a charge density profile as a function of depth having two local makinla and a nonzero local minimum disposed between the two local maxima;
wherein each heterojunction comprises an interface between (Al, In, Ga)N materials sufficiently different in bandgap character that a two-dimensional electron gas is formable therebetween; and
wherein the local minimum corresponds to an intermediate (Al, In, Ga)N subchannel layer of said at least four layers, said subchannel having a thickness not exceeding 75 Angstroms and being disposed between two channel layers of said at least four layers corresponding to said two local maxima.

48. The FET device of claim 47, wherein said at least four layers include any of a barrier layer and a cap layer, overlying a channel layer of said two channel layer.

49. The FET device of claim 47, wherein said two channel Layers are formed of GaN.

50. The FET device of claim 47, wherein said subchannel layer is formed of AlGaN.

51. The FET device of claim 47, wherein said subchannel layer has a thickness not exceeding 20 Angstrons.

52. The FET device of claim 47, wherein said subchannel layer is of monolayer or near-monolayer thickness.

53. A method of improving linearity without substantial loss of mobility in a HEMT device, comprising fabricating the HEMT device with at least four layers comprising (Al, In, Ga)N materials, said four layers defining three heterojunctions disposed in sufficient proximity to generate a charge density profile as a function of depth having two local maxima and a nonzero local minimum disposed between the two local maxima;
wherein each heteroj unction comprises an interface between (Al, In, Ga)N materials sufficiently different in bandgap character that a two-dimensional electron gas is formable therebetween; and
wherein the local minimum corresponds to an intermediate (Al, In, Ga)N subchannel layer of said at least four layers, said subchannel having a thickness not exceeding 75 Arigatroms and being disposed between two channel layers of said at least four layers corresponding to said two local maxima.

54. The method of claim 53, wherein the at least four layers deposited on or over a substrate by vapor phase processing.

55. The method of claim 54, wherein said vapor phase processing is carried out at temperature in a range of from 500° C. to 120° C., and pressure in a range of from 20 to 950 millibar.

56. The method of claim 54, wherein said vapor phase processing comprises a process selected from MBE, MOCVD, and ALE.

* * * * *

UNITED STATES PATENT AND TRADEMARK OFFICE
CERTIFICATE OF CORRECTION

PATENT NO.         : 7,253,454 B2
APPLICATION NO. : 11/073484
DATED              : August 7, 2007
INVENTOR(S)       : Adam William Saxler It is certified that error appears in the above-identified patent and that said Letters Patent is hereby corrected as shown below:

Cover page, in the References Cited. U.S. Patent Documents, third entry, "Walukiewicz et al." should be -- Chavarkar, et al. --.

Column 10, line 4 (claim 6): "AIN" should be -- AlN --.

Column 10, line 8 (claim 8): "fanned" should be -- formed --.

Column 10, line 12 (claim 10): "AIN" should be -- AlN --.

Column 10, line 33 (claim 17): "5, Angstroms" should be -- 5 Angstroms --.

Column 10, line 43 (claim 21): "die group" should be -- the group --.

Column 10, line 67 (claim 26); "with, any" should be -- with any --.

Column 11, lime 5 (claim 28): "tower" should be-- lower --.

Column 11, line 16 (claim 30): "AIN" should be -- AlN --.

Column 11, line 21 (claim 32): "AIN" should be -- AlN --.

Column 11, line 24 (claim 33): "Formed" should be-- formed --.

Column 11, line 35 (claim 37): "AIN" should be -- AlN --.

Column 11, lint 37 (claim 38): "$Al_xIn_yGa_2N$" should be -- $Al_xIn_yGa_zN$ --.

Column 11, line 60 (claim 43): "AIN" should be -- AlN --.

Column 11, line 66 (claim 43): "AIN" should be -- AlN --.

Column 12, line 2 (claim 44): "AIN" should be -- AlN --.

Column 12, line 14 (claim 47): "makinla" should be -- maxima --.

Column 12, line 31 (claim 49): "Layers" should be -- layers --.

Column 12, line 46 (claim 46): "heteroj unction" should be -- heterojunction --.

UNITED STATES PATENT AND TRADEMARK OFFICE
CERTIFICATE OF CORRECTION

PATENT NO. : 7,253,454 B2
APPLICATION NO. : 11/073484
DATED : August 7, 2007
INVENTOR(S) : Adam William Saxler It is certified that error appears in the above-identified patent and that said Letters Patent is hereby corrected as shown below:

Column 12, line 53 (claim 53): "Arigatroms" should be -- Angstroms --.

Signed and Sealed this

Thirteenth Day of November, 2007

JON W. DUDAS
*Director of the United States Patent and Trademark Office*